United States Patent
Yan et al.

(10) Patent No.: US 10,268,095 B2
(45) Date of Patent: Apr. 23, 2019

(54) ARRAY SUBSTRATE, LIQUID CRYSTAL DISPLAY PANEL AND LIQUID CRYSTAL DISPLAY DEVICE

(71) Applicant: Wuhan China Star Optoelectronics Technology Co., Ltd., Wuhan, Hubei (CN)

(72) Inventors: Yao Yan, Guangdong (CN); Shangcao Cao, Guangdong (CN)

(73) Assignee: Wuhan China Star Optoelectronics Co., Ltd, Wuhan, Hubei (CN)

( * ) Notice: Subject to any disclaimer, the term of this patent is extended or adjusted under 35 U.S.C. 154(b) by 0 days.

(21) Appl. No.: 16/126,078

(22) Filed: Sep. 10, 2018

(65) Prior Publication Data

US 2019/0004352 A1 Jan. 3, 2019

Related U.S. Application Data

(62) Division of application No. 15/208,928, filed on Jul. 13, 2016, now Pat. No. 10,088,726.

(51) Int. Cl.
*G02F 1/136* (2006.01)
*G02F 1/1368* (2006.01)
*H01L 27/12* (2006.01)

(52) U.S. Cl.
CPC ........ *G02F 1/1368* (2013.01); *H01L 27/1222* (2013.01); *H01L 27/1255* (2013.01); *G02F 2202/104* (2013.01)

(58) Field of Classification Search
CPC ............. H01L 27/1222; H01L 27/1255; G02F 1/1368
See application file for complete search history.

(56) References Cited

U.S. PATENT DOCUMENTS

| | | | | |
|---|---|---|---|---|
| 5,182,620 A | * | 1/1993 | Shimada | G02F 1/136213 257/72 |
| 5,666,180 A | * | 9/1997 | Ishizaki | G02F 1/136213 351/54 |
| 5,784,132 A | * | 7/1998 | Hashimoto | G02F 1/136209 349/111 |
| 5,982,467 A | * | 11/1999 | Lee | G02F 1/13458 349/138 |
| 6,091,466 A | * | 7/2000 | Kim | G02F 1/136286 257/59 |
| 6,362,028 B1 | * | 3/2002 | Chen | G02F 1/136213 257/59 |

(Continued)

*Primary Examiner* — James A Dudek
(74) *Attorney, Agent, or Firm* — Andrew C. Cheng

(57) ABSTRACT

The array substrate, the liquid crystal display panel and the liquid crystal display device of the present disclosure are designed to from the MIS storage capacitor by the P-Si semiconductor layer, the first metal layer and the insulating layer between above or the P-Si semiconductor layer, the second metal layer and the dielectric spacer layer between above, when one side of the first metal layer or the second metal layer receiving the negative gray voltage, the P-Si in the P-Si semiconductor layer will gather to form the hole, when receiving the positive gray voltage, will form the depletion layer on the upper layer of the P-Si to reduce the capacity of the MIS storage capacitor, thereby reducing the difference of the capacitance when the MIS storage capacitor in the positive and negative gray voltage, improving the flicker phenomena and ensuring the display effect.

5 Claims, 7 Drawing Sheets

(56) References Cited

U.S. PATENT DOCUMENTS

| | | | | |
|---|---|---|---|---|
| 7,088,401 B1* | 8/2006 | Ihara | G02F 1/136213 | |
| | | | 257/72 | |
| 8,027,007 B2* | 9/2011 | Chae | G02F 1/136286 | |
| | | | 349/147 | |
| 8,575,612 B2* | 11/2013 | Lee | H01L 27/1255 | |
| | | | 257/59 | |
| 9,673,231 B2* | 6/2017 | Shu | H01L 27/124 | |
| 9,722,010 B2* | 8/2017 | Tsuno | H05B 33/22 | |
| 9,778,523 B2* | 10/2017 | Cao | G02F 1/136213 | |
| 10,088,726 B2* | 10/2018 | Yan | G02F 1/1368 | |
| 10,120,249 B2* | 11/2018 | Ma | G02F 1/133345 | |
| 2002/0036726 A1 | 3/2002 | Choo | G02F 1/133553 | |
| | | | 349/43 | |
| 2002/0196383 A1* | 12/2002 | Chae | G02F 1/136227 | |
| | | | 349/43 | |
| 2003/0201437 A1* | 10/2003 | Zhang | H01L 27/127 | |
| | | | 257/59 | |
| 2007/0103610 A1* | 5/2007 | Lee | G02F 1/136213 | |
| | | | 349/38 | |
| 2008/0002074 A1* | 1/2008 | Lee | G02F 1/136213 | |
| | | | 349/38 | |
| 2012/0104399 A1* | 5/2012 | Choi | H01L 27/1255 | |
| | | | 257/59 | |
| 2014/0141574 A1* | 5/2014 | Zhan | H01L 28/87 | |
| | | | 438/155 | |
| 2015/0179724 A1* | 6/2015 | Lee | H01L 27/3241 | |
| | | | 257/40 | |
| 2015/0206905 A1* | 7/2015 | Wang | H01L 29/78621 | |
| | | | 257/72 | |
| 2017/0062549 A1* | 3/2017 | Tsuno | H05B 33/22 | |
| 2017/0212375 A1* | 7/2017 | Yan | G02F 1/1368 | |
| 2017/0212396 A1* | 7/2017 | Cao | G02F 1/136213 | |
| 2017/0343873 A1* | 11/2017 | Ma | G02F 1/133345 | |

* cited by examiner

ARRAY SUBSTRATE, LIQUID CRYSTAL DISPLAY PANEL AND LIQUID CRYSTAL DISPLAY DEVICE

CROSS REFERENCE TO RELATED APPLICATIONS

This is a divisional application of co-pending U.S. patent application Ser. No. 15/208,928, filed on Jul. 13, 2016, claiming foreign priority of Chinese Patent Application No. 201610049494.1, filed on Jan. 25, 2016.

FIELD OF THE DISCLOSURE

The present disclosure relates to a liquid crystal display field, and more particularly to an array substrate, a liquid crystal display panel and a liquid crystal display device.

BACKGROUND OF THE DISCLOSURE

The liquid crystal display (LCD) generating flicker phenomena has a variety of reasons, the main reason is the difference of the thin film transistor (TFT) leakage, i.e. the leakage of the TFT applying negative gray voltage is greater than the leakage of the TFT applying positive gray voltage, so that the capacity of the storage capacitor of the array substrate applying positive and negative gray voltage has the difference. With the LCD is widely used in various display fields and in order to reduce the power consumption, the LCDs are often applied a lower source driving voltage, so that the difference of the gray voltage of the adjacent gray is smaller, the flicker phenomena are generated more easily, effect the display.

SUMMARY OF THE DISCLOSURE

In view of this, the present disclosure provides an array substrate, a liquid crystal display panel and a liquid crystal display device, the flicker phenomena can be improved to ensure the display.

The present disclosure provides an array substrate, the array substrate includes a substrate and a first metal layer, an insulating layer, a P-Si semiconductor layer, a dielectric spacer layer and a second metal layer formed on the substrate, the first metal layer includes a first zone and a second zone arranged spaced, the first metal layer of the first zone is the gate electrode of the TFT of the array substrate, the second metal layer includes a third zone and a fourth zone arranged spaced, the second metal layer of the third zone and the fourth zone are the source electrode and the drain electrode of the TFT, respectively, wherein, the P-Si semiconductor layer and the first metal layer of the second zone are arranged insulated and overlapped through the insulating layer sandwiched between the P-Si semiconductor layer and the first metal layer of the second zone, or the P-Si semiconductor and the second metal layer of the fourth zone are arranged insulated and overlapped through the dielectric spacer layer sandwiched between the P-Si semiconductor layer and the second metal layer of the fourth zone to form the MIS storage capacitor of the array substrate.

Wherein, the gate electrode of the TFT is on the P-Si semiconductor layer, the array substrate further includes a shading metal layer forming on the substrate and a buffer layer arranged between the shading metal layer and the P-Si semiconductor layer, the shading metal layer includes a fifth zone and a sixth zone arranged spaced, the fifth zone is under the first zone, the buffer layer forms a first contact hole, the P-Si semiconductor layer connects the second metal layer of the fourth zone by through the first contact hole, the first metal layer of the second zone connects the second metal layer of the fourth zone, so that the MIS storage capacitor of the array substrate is formed by the P-Si semiconductor layer, the first metal layer of the second zone and the insulating layer between above.

Wherein, the gate electrode of the TFT is on the P-Si semiconductor layer, the array substrate further includes a shading metal layer forming on the substrate and a buffer layer arranged between the shading metal layer and the P-Si semiconductor layer, the shading metal layer includes a fifth zone and a sixth zone arranged spaced, the fifth zone is under the first zone, the second metal layer further includes a seventh zone arranged spaced and adjacent with the fourth zone and away from the third zone, the P-Si semiconductor layer connects the shading metal layer of the sixth zone through the second metal layer of the seventh zone, the first metal layer of the second zone connects the second metal layer of the second zone, so that the MIS storage capacitor of the array substrate is formed by the P-Si semiconductor layer, the first metal layer of the second zone and the insulating layer between above.

Wherein, the shading metal layer of the sixth zone is across the active area of the array substrate, the array substrate further includes a common electrode arranged on the substrate, the shading metal layer of the sixth zone connects the common electrode at the periphery of the active area.

Wherein, the gate electrode of the TFT is under the P-Si semiconductor layer, the insulating layer forms a second contact hole, the P-Si semiconductor layer connects the first metal layer of the second zone through the second contact hole, so that the MIS storage capacitor of the array substrate is formed by the P-Si semiconductor layer, the first metal layer of the second zone and the insulating layer between above.

Wherein, the gate electrode of the TFT is under the P-Si semiconductor layer, the second metal layer further includes a seventh zone arranged spaced and adjacent with the fourth zone and away from the third zone, the P-Si semiconductor layer connects the first metal layer of the second zone through the second metal layer of the seventh zone, so that the MIS storage capacitor of the array substrate is formed by the P-Si semiconductor layer, the first metal layer of the second zone and the insulating layer between above.

Wherein, the first metal layer of the second zone is across the active area of the array substrate, the array substrate further includes a common electrode arranged on the substrate, the first metal layer of the second zone connects the common electrode at the periphery of the active area.

Wherein, the P-Si semiconductor layer includes a P-Si layer after heavy doping treatment.

The present disclosure provides a liquid crystal display panel including the above array substrate.

The present disclosure providing a liquid crystal display device includes the above liquid crystal display panel and a light source module providing light for the liquid crystal display panel.

The array substrate, the liquid crystal display panel and the liquid crystal display device of the present disclosure are designed to form a MIS storage capacitor by the P-Si semiconductor layer, the first metal layer and the insulating layer between above or the P-Si semiconductor layer, the second metal layer and the dielectric spacer layer between above, when one side of the first metal layer or the second metal layer receiving the negative gray voltage, the P-Si in the P-Si semiconductor layer will gather to form a hole, and when receiving the positive gray voltage, will form a depletion layer on the upper layer of the P-Si to reduce the capacitance of the MIS storage capacitor, thereby reducing the difference of the capacitance when the MIS storage capacitor in the positive and negative gray voltage, improving the flicker phenomena and ensuring the display effect.

DETAILED DESCRIPTION OF PREFERRED EMBODIMENTS

Figure 1:
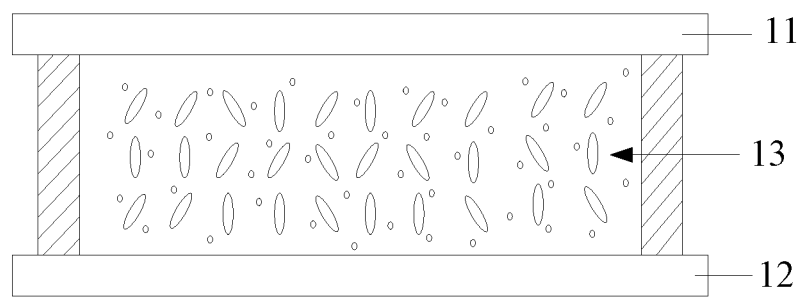
FIG. 1 is a sectional structure view of the liquid crystal display panel of an embodiment of the present disclosure.

FIG. 1 is a sectional structure view of the liquid crystal display panel of an embodiment of the present disclosure. As shown in FIG. 1, the liquid crystal display panel 10 of the present embodiment includes a color filter substrate 11 (CF) and a thin film transistor substrate (TFT substrate, also called array substrate) 12 arranged relatively spaced and a liquid crystal 13 (liquid crystal molecules) filled between two substrates, the liquid crystal 13 is in the liquid crystal cell formed by overlapping the array substrate 12 and the color filter substrate 11.

Figure 2:
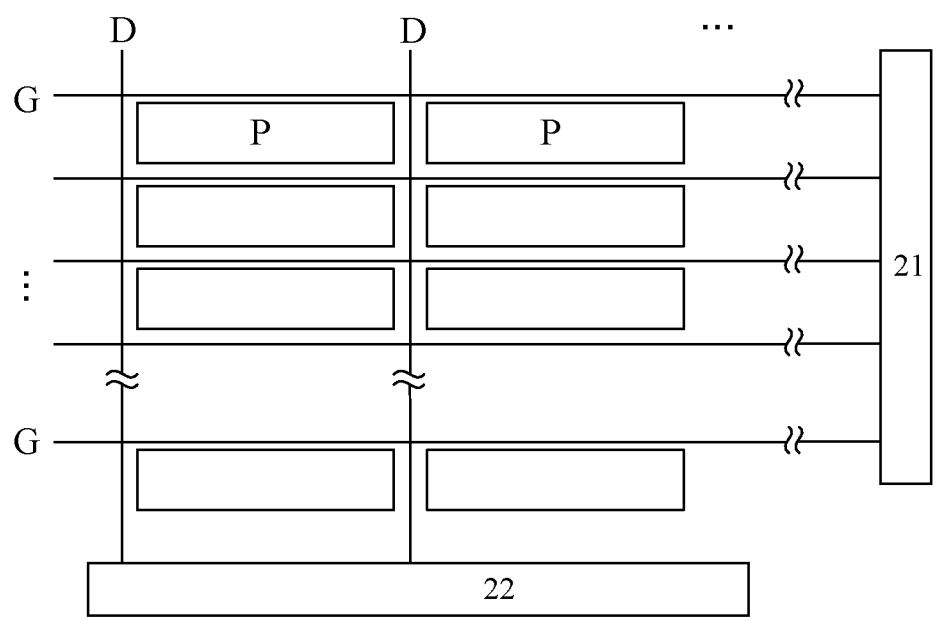
FIG. 2 is a pixel structure diagram of an embodiment of the liquid crystal display panel shown in FIG. 1.
Figure 3:
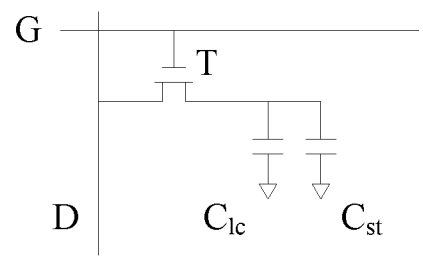
FIG. 3 is an equivalent circuit diagram of the pixel structure shown in FIG. 2.

Combine the pixel structure diagram of the liquid crystal display panel 10 shown in FIG. 2, the array substrate 12 includes a plurality of data lines D arranged alone the column direction, a plurality of scan lines G arranged alone the row direction and a plurality of pixel zones P defined by the scan line G and the data line D, wherein each pixel zone P connects the corresponding data line D and the corresponding scan line G, each scan line G connecting the gate driver 21 is used to provide the scan voltage to each pixel zone P, each data line D connecting the source driver 22 is used to provide gray voltage to each pixel zone P. Further combine the equivalent circuit diagram of the pixel structure shown in FIG. 3, the array substrate 12 includes a thin film transistor T, a storage capacitor $C_{st}$ and a liquid crystal capacitor $C_{lc}$, the liquid crystal capacitor $C_{lc}$, is formed by the pixel electrode of the pixel zone P, the common electrode of the liquid crystal display panel 10 and the liquid crystal 13 between above.

According to the display principle of the liquid crystal display panel 10, through the scan line G inputs the scan voltage, the thin film transistor T located in the same row is opened at same time, and after a certain time the next row of the thin film transistor T is opened at same time, and so on. Because open time of each row of the thin film transistor T is shorter, the time of the liquid crystal capacitor $C_{lc}$, charging controlling the liquid crystal 13 deflected is shorter and is difficult to achieve the response time of the LCD 13, the storage capacitor $C_{st}$ can be used to maintain the voltage of the pixel zone P after the thin film transistor T is turned off, so as to provide the response time to the liquid crystal 13.

Figure 4:
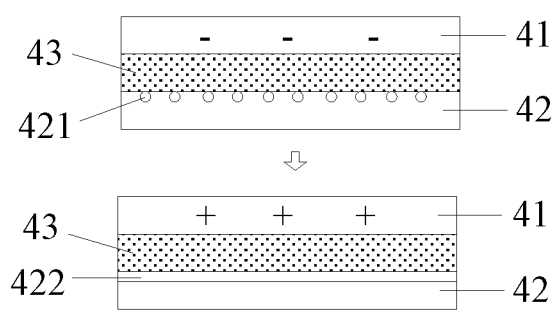
FIG. 4 is a sectional structure view of the storage capacitor shown in FIG. 3.

The storage capacitor $C_{st}$ of the present embodiment is a metal insulator semiconductor (MIS) storage capacitor, as shown in FIG. 4, the MIS storage capacitor $C_{st}$ is formed in an insulating and overlapping mode by the metal layer 41, the polycrystalline silicon (P-Si silicon, P-Si) semiconductor layer 42 and the insulating layer 43 sandwiched between above. The P-Si semiconductor layer 42 corresponding to the zone of the MIS storage capacitor $C_{st}$ is the heavily doped processed P-Si layer. Preferably, heavily dopes the beryllium (Be) in the P-Si layer.

Figure 5:
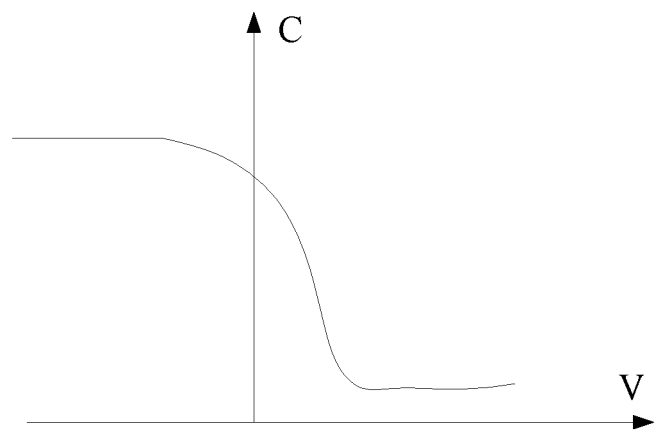
FIG. 5 is a C-V graph of the storage capacitor shown in FIG. 3.

When one side of the metal layer 41 receiving the negative gray voltage, the P-Si in the P-Si semiconductor layer 42 will gather to form a hole 421, when the gray voltage of the metal layer 41 received is from negative to positive, the hole 421 in the zone will form a depletion layer 422, i.e. forming a depletion layer 422 on upper layer of the P-Si, the depletion layer 422 can reduce the capacity of the MIS storage capacity $C_{st}$. That is, the MIS storage capacitor $C_{st}$ of the present embodiment corresponds to a variable capacitor, further combine the C-V graph shown in FIG. 5, when the gray voltage is negative, the capacity of the MIS storage capacitor $C_{st}$ is $C_1$, when the gray voltage is positive, the capacity of the MIS storage capacitor $C_{st}$ is $C_2=C1*C_0/(C_1+C_0)$, wherein the $C_0$ is the capacity between the depletion layer 422 and the metal layer 41, understood $C_1>C_2$, i.e. the capacity of the MIS storage capacitor receiving the negative gray voltage is greater than the capacity receiving the positive gray voltage. The leakage of the thin film transistor T is larger since the gray voltage is negative, when the embodiment of the present disclosure increasing the capacitor of MIS storage capacitor $C_{st}$, the leakage of the thin film transistor T is reduced, thereby the effect of the TFT leakage is reduced, i.e. reduce the capacitance difference of the MIS storage capacitor $C_{st}$ receiving the positive and negative gray voltage to improve the flicker phenomenon and ensure the display effect of the liquid crystal display panel 10.

In the different design of the pixel structure, the metal layer 41 of the MIS storage capacitor $C_{st}$ and the insulating layer 43 of the liquid crystal display panel 10 are different structure. Hereinafter, combine the FIGS. 6-13 to describe the technical solution of the embodiment of the present clearly and completely.

Figure 6:
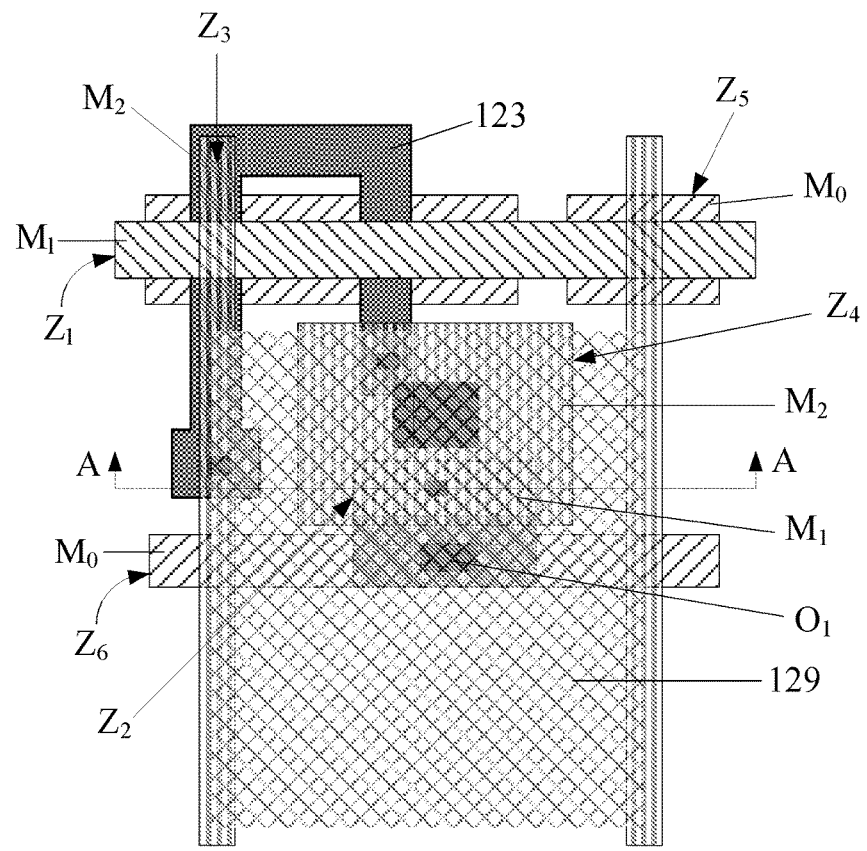
FIG. 6 is a sectional structure view of the pixel zone of the first embodiment of the present disclosure.
Figure 7:
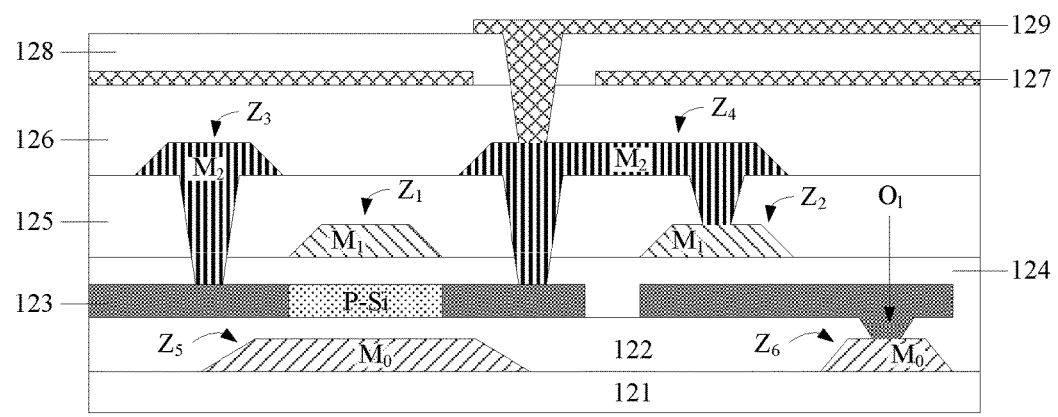
FIG. 7 is a sectional structure view of the pixel zone alone the A-A line shown in FIG. 6.

FIG. 6 is a sectional structure view of the pixel zone of the first embodiment of the present disclosure, and FIG. 7 is a sectional structure view of the pixel zone alone the A-A line shown in FIG. 6. Combine FIG. 6 and FIG. 7, the array substrate 12 includes a substrate 121 and an eleven layers structure forming on the substrate 121 sequentially: a shading metal layer $M_0$, a buffer layer 122, a P-Si semiconductor layer 123, an insulating layer 124 (also called gate insulation layer), a first metal layer $M_1$, a dielectric spacer layer 125 (also called interlayer dielectric isolation), a second metal layer $M_2$, a flat passivation layer 126, a common electrode 127, a Passivation (PV) layer 128 and a pixel electrode 129. The P-Si semiconductor layer 123, the first metal layer $M_1$ of the first zone $Z_1$, the second metal layer $M_2$ of the third zone $Z_3$ and the fourth zone $Z_4$ and the insulating layer 124 and the dielectric spacer layer 125 sandwiched between above are form the thin film transistor T of the array substrate 12.

In the present embodiment, the first metal layer $M_1$ includes a first zone $Z_1$ and a second zone $Z_2$ arranged spaced, the first metal layer $M_1$ of the first zone $Z_1$ is the gate electrode of the thin film transistor T; the second metal layer $M_2$ includes a third zone $Z_3$ and a fourth zone $Z_4$ arranged spaced, the second metal layer $M_2$ of the third zone $Z_3$ and the fourth zone Z4 are the source electrode and the drain electrode of the thin film transistor T respectively; the shading metal layer $M_0$ includes a fifth zone $Z_5$ and sixth zone $Z_6$ arranged spaced, the fifth zone $Z_5$ is under the first zone $Z_1$. In view of the gate electrode of the thin film transistor T is on the P-Si semiconductor layer 123, the pixel zone P of the present embodiment may be regarded as a top gate type pixel design.

In present embodiment, a first contact hole $O_1$ is formed by the buffer layer 122, the P-Si semiconductor layer 123 connects the shading metal layer $M_0$ of the sixth zone $Z_6$ through the first contact hole $O_1$, the shading metal layer $M_0$ of the sixth zone $Z_6$ is across the active area (AA) of the array substrate 12 and connects the common electrode 127 at the periphery of the active area to receive the voltage from the common electrode 127; the first metal layer $M_1$ of the second zone $Z_2$ connects the second metal layer $M_2$ of the fourth zone $Z_4$ to receive the gray voltage from the second metal layer $M_2$, so that the P-Si semiconductor layer 123 and the first metal layer $M_1$ of the second zone $Z_2$ are arranged insulated and overlapped through the insulating layer 124 between above to form the MIS storage capacitor $C_{st}$ of the array substrate 12. That is, the first metal layer $M_1$ of the second zone $Z_2$ of the present embodiment forms the metal layer 41 of the MIS storage capacitor $C_{st}$ shown in FIG. 4, the insulating layer 124 forms the insulating layer 43 shown in FIG. 4.

In the full description of the embodiment of the present disclosure, the P-Si semiconductor layer 123 corresponding to the zone of the thin film transistor T includes the P-Si layer without heavily doped treatment, i.e. the P-Si semiconductor layer 123 includes two zones arranged spaced, one zone includes the P-Si layer without heavily doped treatment, another zone is a P-Si layer after heavily doped treatment, the another zone is the MIS storage capacitor $C_{st}$ of the array substrate 12 formed by the P-Si semiconductor layer 123 after heavily doped treatment, the first metal layer $M_1$ of the second zone $Z_2$ and the insulating layer 124 between above.

Figure 8:
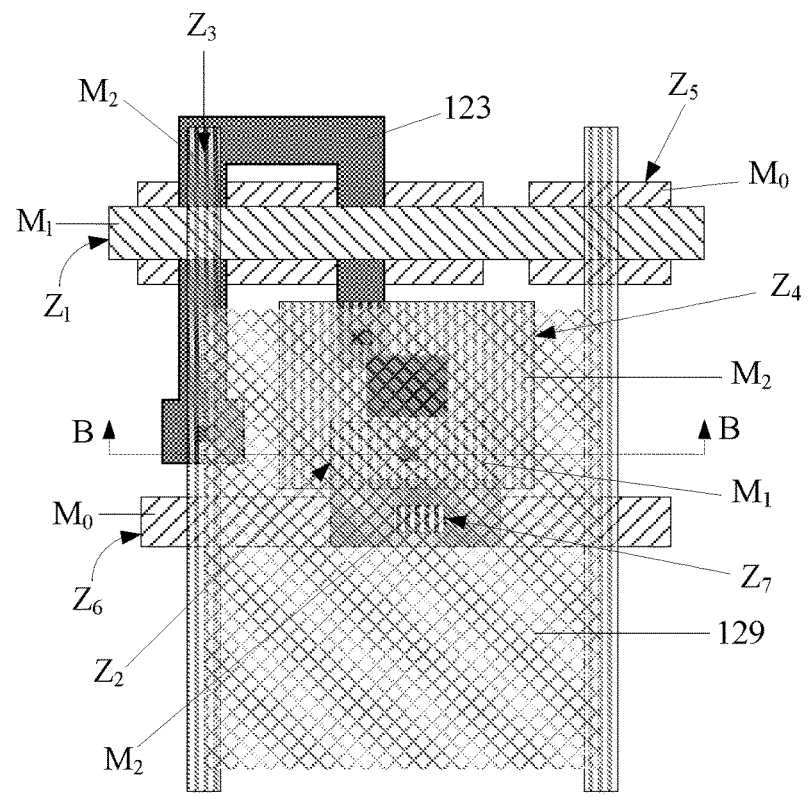
FIG. 8 is a schematic structure view of the pixel zone of the second embodiment of the present disclosure.
Figure 9:
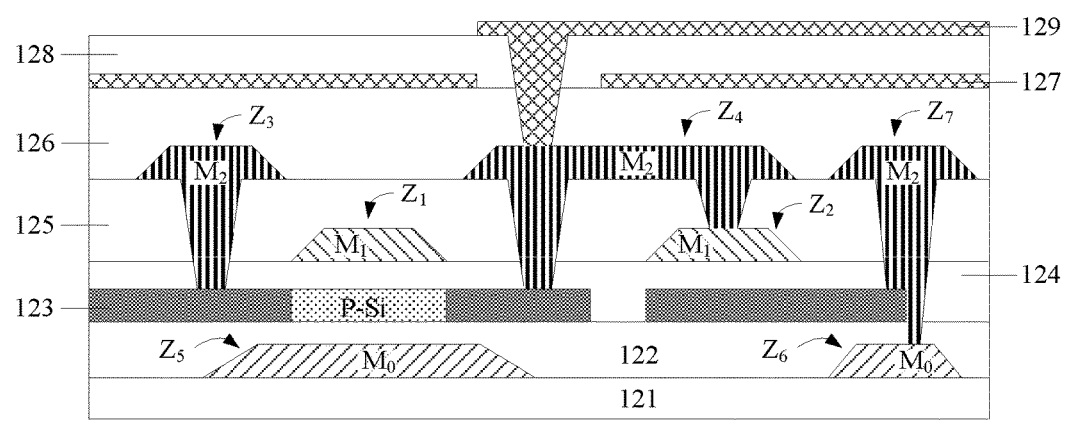
FIG. 9 is a sectional structure view of the pixel zone alone the B-B line shown in FIG. 8.

FIG. 8 is a schematic structure view of the pixel zone of the second embodiment of the present disclosure, and FIG. 9 is a sectional structure view of the pixel zone alone the B-B line shown in FIG. 8. To facilitate the above-described embodiment differs, mark the same reference numerals to the same structural elements. Combine the FIG. 8 and FIG. 9, the array substrate 12 includes the substrate 121 and the eleven layers structure forming on the substrate 121 sequentially: the shading metal layer $M_0$, the buffer layer 122, the P-Si semiconductor layer 123, the insulating layer 124, the first metal layer $M_1$, the dielectric spacer layer 125, the second metal layer $M_2$, the flat passivation layer 126, the common electrode 127, the PV layer 128 and the pixel electrode 129. The thin film transistor T is formed by the P-Si semiconductor layer 123, the first metal layer $M_1$ of the first zone $Z_1$, the second metal layer $M_2$ of the third zone $Z_3$ and the fourth zone $Z_4$ and the insulating layer 124 and the dielectric spacer layer 125 sandwiched between above.

The first metal layer $M_1$ includes a first zone $Z_1$ and a second zone $Z_2$ arranged spaced, the first metal layer $M_1$ of the first zone $Z_1$ is the gate electrode of the thin film transistor T; the second metal layer $M_2$ includes a third zone $Z_3$ and a fourth zone $Z_4$ arranged spaced, the second metal layer $M_2$ of the third zone $Z_3$ and the fourth zone $Z_4$ are the source electrode and drain electrode of the thin film transistor T respectively; the shading metal layer $M_0$ includes a fifth zone $Z_5$ and a sixth zone $Z_6$ arranged spaced, the fifth zone $Z_5$ is under the first zone $Z_1$. In view of the gate electrode of the thin film transistor T is on the P-Si semiconductor layer 123, the pixel zone P of the present embodiment may be regarded as a top gate type pixel design.

In the present embodiment, the second metal layer $M_2$ further includes a seventh zone $Z_7$ arranged spaced and adjacent with the fourth zone $Z_4$ and away from the third zone $Z_3$, the P-Si semiconductor 123 connects the shading metal layer $M_0$ of the sixth zone $Z_6$ through the second metal layer $M_2$ of the seventh zone $Z_7$, the shading metal layer $M_0$ of the sixth zone $Z_6$ is across the active area of the array substrate 12 and connects the common electrode 127 at the periphery of the active area to receive the voltage from the common electrode 127; the first metal layer $M_1$ of the second zone $Z_2$ connects the second metal layer $M_2$ of the fourth zone $Z_4$ to receive the gray voltage from the second metal layer $M_2$, so that the P-Si semiconductor layer 123 and the first metal layer $M_1$ of the second zone $Z_2$ are arranged insulated and overlapped through the insulating layer 124 between above to form the MIS storage capacitor $C_{st}$ of the array substrate 12. That is, the first metal layer $M_1$ of the second zone $Z_2$ of the present embodiment forms the metal layer 41 of the MIS storage capacitor $C_{st}$ shown in FIG. 4, the insulating layer 124 forms the insulating layer 43 shown in FIG. 4.

he different between the embodiment shown in FIG. 6 and FIG. 7 is the present embodiment using the bridging of the second metal layer $M_2$ of the seventh zone $Z_7$ to achieve the connection of the P-Si semiconductor layer 123 and the shading metal layer $M_0$ of the sixth zone $Z_6$, without forming a first contact hole $O_1$ on the buffer layer 122.

Figure 10:
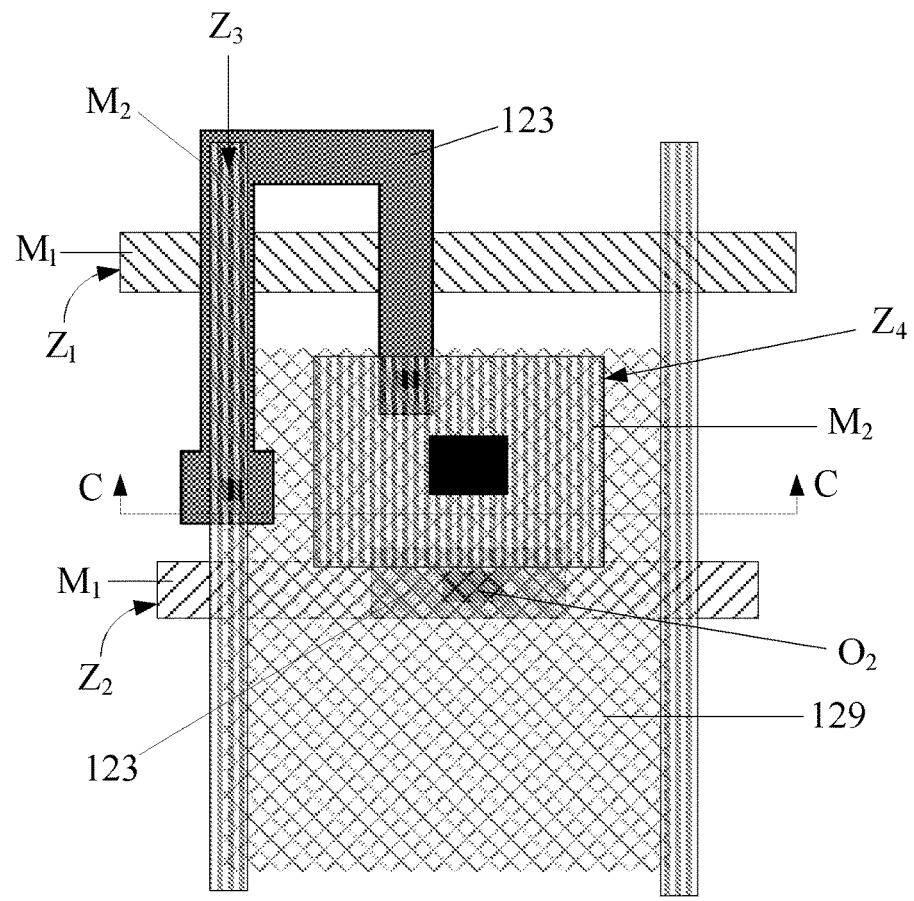
FIG. 10 is a schematic structure view of the pixel zone of the first embodiment of the present disclosure.
Figure 11:
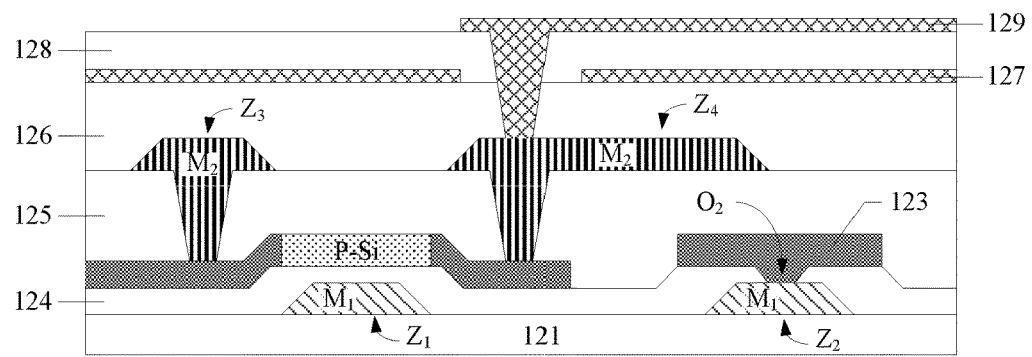
FIG. 11 is a sectional structure view of the pixel zone alone the C-C line shown in FIG. 10.

FIG. 10 is a schematic structure view of the pixel zone of the first embodiment of the present disclosure, and FIG. 11 is a sectional structure view of the pixel zone alone the C-C line shown in FIG. 10. To facilitate the above-described embodiment differs, mark the same reference numerals to the same structural elements. Combine the FIG. 10 and FIG. 11, the array substrate 12 includes the substrate 121 and the ten layers structure forming on the substrate 121 sequentially: the first metal layer $M_1$, the insulating layer 124, the P-Si semiconductor layer 123, the dielectric spacer layer 125, the second metal layer $M_2$, the flat passivation layer 126, the common electrode 127, the PV layer 128 and the pixel electrode 129. The P-Si semiconductor layer 123, the first metal layer $M_1$ of the first zone $Z_1$, the second metal layer $M_2$ of the third zone $Z_3$ and the fourth zone $Z_4$ and the insulating layer 124 and the dielectric spacer layer 125 sandwiched between above are form the thin film transistor T of the array substrate 12.

In the present embodiment, the first metal layer $M_1$ includes a first zone $Z_1$ and a second zone $Z_2$ arranged spaced, the first metal layer $M_1$ of the first zone $Z_1$ is the gate electrode of the thin film transistor T; the second metal layer $M_2$ includes a third zone $Z_3$ and a fourth zone $Z_4$ arranged spaced, the second metal layer $M_2$ of the third zone $Z_3$ and the fourth zone $Z_4$ are the source electrode and the drain electrode of the thin film transistor T respectively. In view of the gate electrode of the thin film transistor T is under the P-Si semiconductor layer 123, the pixel zone P of the present embodiment may be regarded as a bottom gate type pixel design.

A second contact hole $O_2$ is formed by the insulating layer 124, the P-Si semiconductor layer 123 connects the first metal layer $M_1$ of the second zone $Z_2$ through the second contact hole $O_2$, the first metal layer of the second zone $Z_2$ is across the active area of the array substrate 12 and connects the common electrode 127 at the periphery of the active area to receive voltage; the second metal layer $M_2$ of the fourth zone $Z_4$ connects the pixel electrode 129 to receive the gray voltage from the pixel electrode 129, so that the P-Si semiconductor 123 and the second metal layer $M_2$ of the fourth zone $Z_4$ are arranged insulated and overlapped through the dielectric spacer 125 between above to form the MIS storage capacitor $C_{st}$ of the array substrate 12. This means that the second metal layer $M_2$ of the fourth zone $Z_4$ of the present embodiment forms the metal layer 41 of the MIS storage capacitor $C_{st}$ shown in FIG. 4 and the dielectric spacer layer 125 forms the insulating layer 43 shown in FIG. 4.

Figure 12:
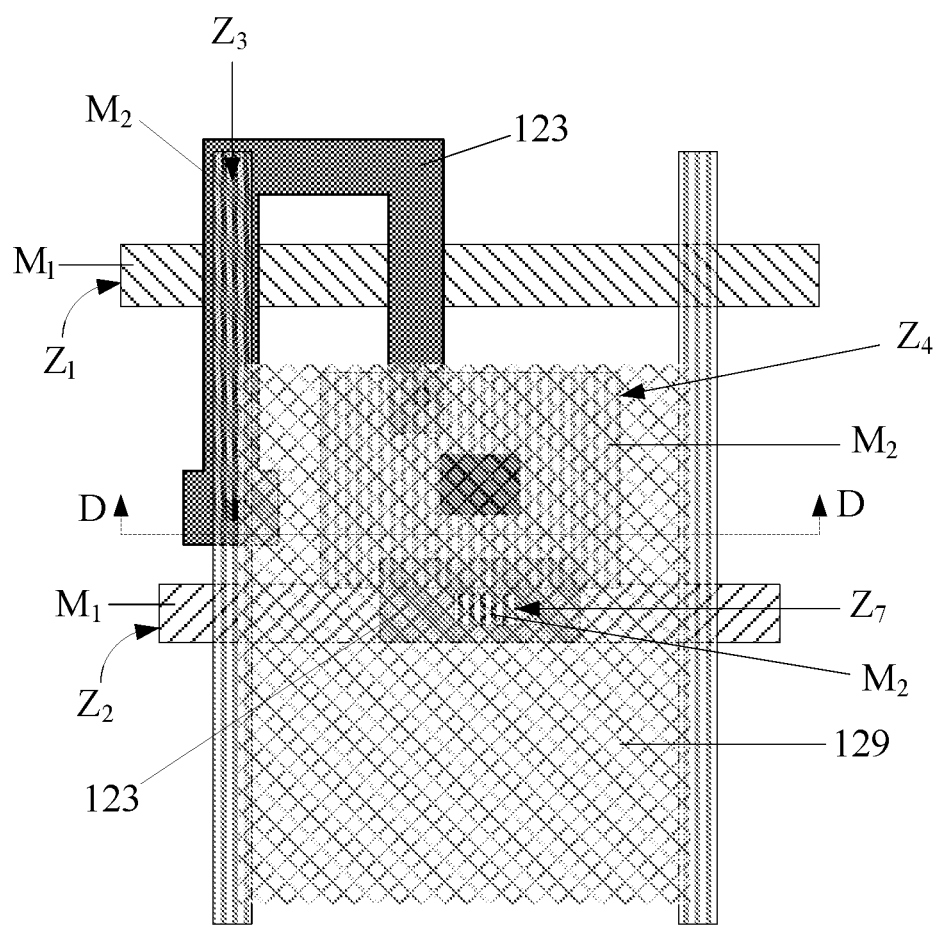
FIG. 12 is a schematic structure view of the pixel zone of the first embodiment of the present disclosure.
Figure 13:
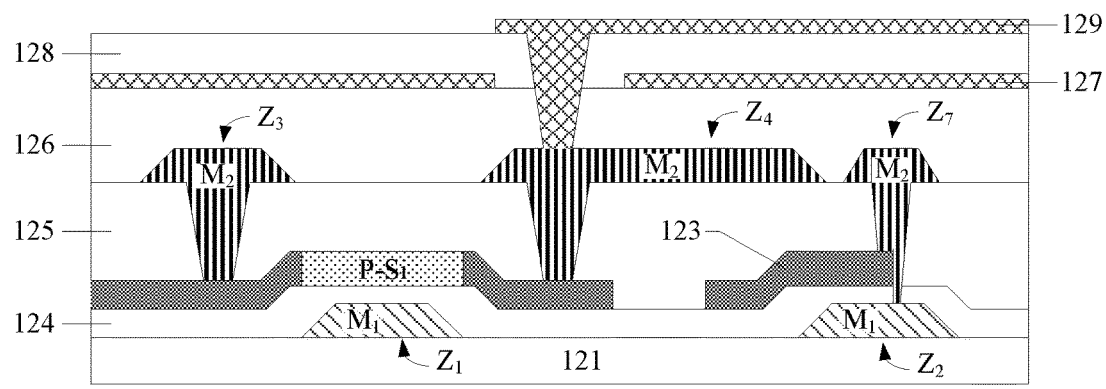
FIG. 13 is a sectional structure view of the pixel zone alone the D-D line shown in FIG. 12.

FIG. 12 is a schematic structure view of the pixel zone of the first embodiment of the present disclosure, and FIG. 13 is a sectional structure view of the pixel zone alone the D-D line shown in FIG. 12. To facilitate the above-described embodiment differs, mark the same reference numerals to the same structural elements. Combine the FIG. 12 and the FIG. 13, the array substrate 12 includes a substrate 121 and the ten layers structure forming on the substrate 121 sequentially: the first metal layer $M_1$, the insulating layer 124, the P-Si semiconductor layer 123, the dielectric spacer layer 125, the second metal layer $M_2$, the flat passivation layer 126, the common electrode 127, the PV layer 128 and the pixel electrode 129. The P-Si semiconductor layer 123, the first metal layer $M_1$ of the first zone $Z_1$, the second metal layer $M_2$ of the third zone $Z_3$ and the zone $Z_4$ and the insulating layer 124 and the dielectric spacer layer 125 sandwiched between above from the thin film transistor T of the array substrate 12.

In the present embodiment, the first metal layer $M_1$ includes a first zone $Z_1$ and a second zone $Z_2$ arranged spaced, the first metal layer $M_1$ of the first zone $Z_1$ is the gate electrode of the thin film transistor; the second metal layer $M_2$ includes a third zone $Z_3$ and a fourth zone $Z_4$ arranged spaced, the second metal layer $M_2$ of the third zone $Z_3$ and the fourth zone $Z_4$ is the source electrode and the drain electrode of the thin film transistor T respectively. In view of the gate electrode of the thin film transistor T is under the P-Si semiconductor layer 123, the pixel zone P of the present embodiment may be regarded as a bottom gate type pixel design.

The second metal layer $M_2$ further includes a seventh zone $Z_7$ arranged spaced and adjacent with the fourth zone $Z_4$ and away from the third zone $Z_3$, the P-Si semiconductor 123 connects the first metal layer $M_1$ of the second zone $Z_2$ through the second metal layer $M_2$ of the seventh zone $Z_7$, the first metal layer $M_1$ of the second zone $Z_2$ is across the active area of the array substrate 12 and connects the common electrode 127 at the periphery of the active area to receive the voltage from the common electrode 127; the second metal layer $M_2$ of the fourth zone $Z_4$ connects the pixel electrode 129 to receive the gray voltage from the pixel electrode 129, so that the P-Si semiconductor layer 123 and the second metal layer $M_2$ of the fourth zone $Z_4$ are arranged insulated and overlapped through the dielectric spacer layer 125 between above to form the MIS storage capacitor $C_{st}$ of the array substrate 12. That is, the second metal layer $M_2$ of the fourth zone $Z_4$ of the present embodiment forms the metal layer 41 of the MIS storage capacitor $C_{st}$ shown in FIG. 4, the dielectric spacer layer 125 forms the insulating layer 43 shown in FIG. 4.

The difference between the embodiment shown in FIG. 10 and FIG. 11 is the present embodiment using the bridging of the second metal layer $M_2$ of the seventh zone $Z_7$ to achieve the connection of the P-Si semiconductor layer 123 and the first metal layer $M_1$ of the second zone $Z_2$, without forming a second contact hole $O_2$ on the insulating layer 124.

In summary, object of the embodiment of the present disclosure is using the P-Si semiconductor layer, the first metal layer and the insulating layer between above or the P-Si semiconductor layer, the second metal layer and the dielectric spacer layer between above to form the MIS storage capacitor, when one side of the first metal layer or the second metal layer receiving the negative gray voltage, the P-Si in the P-Si semiconductor layer will gather to form a hole, when receiving the positive gray voltage, the upper layer of the P-Si will form a depletion layer to reduce the capacity of the MIS storage capacitor, thereby reducing the difference of the capacitance when the MIS storage capacitor in the positive and negative gray voltage, improving the flicker phenomena and ensuring the display effect.

Figure 14:
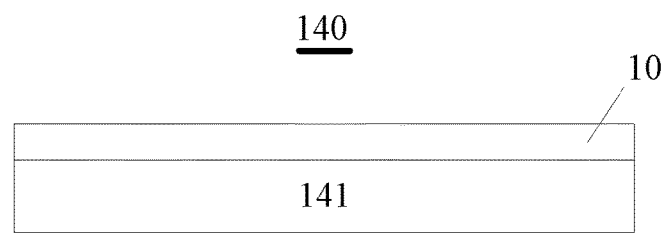
FIG. 14 is a sectional structure view of the liquid crystal display device of an embodiment of the present disclosure.

The embodiment of the present disclosure further provides a liquid crystal display device 140 shown in FIG. 14, the liquid crystal display device 140 includes the said liquid crystal display panel 10 and the light source module 141 providing light to the liquid crystal display panel 10, the liquid crystal display panel 10 can use fringe field switching (FFS) technology. Because the liquid crystal display device 140 has the design of the said array substrate 12 also, it has the same advantageous effects also.

It should be understood, the above are only embodiments of the present disclosure is not patented and therefore limit the scope of the present disclosure, any use of the contents of the present specification and drawings made equivalent or equivalent structural transformation process, either directly or indirectly, use the other relevant technical field, all the same token included in the scope of patent protection within the present disclosure.

What is claimed is:

1. An array substrate, comprising a substrate, and a first metal layer, an insulating layer, a polycrystalline silicon (P-Si) semiconductor layer, a dielectric spacer layer and a second metal layer that are formed on the substrate, wherein the first metal layer comprises a first zone and a second zone spaced from each other, the first zone of the first metal layer being a gate electrode of a thin film transistor (TFT) of the array substrate; the second metal layer comprises a third zone and a fourth zone arranged spaced from each other, the third zone and the fourth zone of the second metal layer being a source electrode and a drain electrode of the TFT, respectively, wherein the P-Si semiconductor layer and the second zone of the first metal layer are arranged insulated and overlapped through the insulating layer sandwiched between the P-Si semiconductor layer and the second zone of the first metal layer, or the P-Si semiconductor layer and the fourth zone of the second metal layer are arranged insulated and overlapped through the dielectric spacer layer sandwiched between the P-Si semiconductor layer and the fourth zone of the second metal layer to form a metal-insulator-semiconductor (MIS) storage capacitor of the array substrate;
  wherein the gate electrode of the TFT is on the P-Si semiconductor layer;
  wherein the array substrate further comprises a shading metal layer formed on the substrate and a buffer layer arranged between the shading metal layer and the P-Si semiconductor layer;
  wherein the shading metal layer comprises a fifth zone and a sixth zone arranged spaced each other, the fifth zone being under the first zone;
  wherein the buffer layer is formed with a first contact hole, the P-Si semiconductor layer being connected with the sixth zone of the shading metal layer through the first contact hole, the second zone of the first metal layer being connected with the fourth zone of the second metal layer, so that the MIS storage capacitor of the array substrate is formed by the P-Si semiconductor layer, the second zone of the first metal layer, and the insulating layer located therebetween.

2. The array substrate according to claim 1, wherein the sixth zone of the shading metal layer of the sixth zone is across an active area of the array substrate, and the array substrate further comprises a common electrode arranged on the substrate, the sixth zone of the shading metal layer of the sixth zone being connected with the common electrode at a periphery of the active area.

3. The array substrate according to claim 1, wherein the P-Si semiconductor layer comprises a P-Si layer after heavy doping treatment.

4. A liquid crystal display panel, comprising the array substrate as claimed in claim 1.

5. A liquid crystal display device, comprising a liquid crystal display panel as claimed in claim 4 and a light source module providing light to the liquid crystal display panel.

* * * * *